(12) United States Patent
Dellaert et al.

(10) Patent No.: US 7,824,528 B2
(45) Date of Patent: Nov. 2, 2010

(54) END-BLOCK FOR A ROTATABLE TARGET SPUTTERING APPARATUS

(75) Inventors: Krist Dellaert, Zottegem (BE); Wilmert De Bosscher, Drongen (BE); Joannes De Boever, Deinze (BE); Stijn Porteman, Izegem (BE)

(73) Assignee: Bekaert Advanced Coatings, Deinze (BE)

( * ) Notice: Subject to any disclaimer, the term of this patent is extended or adjusted under 35 U.S.C. 154(b) by 856 days.

(21) Appl. No.: 11/665,563

(22) PCT Filed: Oct. 11, 2005

(86) PCT No.: PCT/EP2005/055144

§ 371 (c)(1),
(2), (4) Date: Apr. 17, 2007

(87) PCT Pub. No.: WO2006/042808

PCT Pub. Date: Apr. 27, 2006

(65) Prior Publication Data

US 2008/0087541 A1    Apr. 17, 2008

(30) Foreign Application Priority Data

Oct. 18, 2004    (EP) .................................. 04105116

(51) Int. Cl.
*C25B 9/00*    (2006.01)
*C25B 13/00*   (2006.01)
*C25B 11/00*   (2006.01)
*C23C 14/00*   (2006.01)

(52) U.S. Cl. ............................. 204/298.21; 204/298.22
(58) Field of Classification Search ............ 204/298.21, 204/298.22
See application file for complete search history.

(56) References Cited

U.S. PATENT DOCUMENTS

| | | | |
|---|---|---|---|
| 4,356,073 | A | 10/1982 | McKelvey |
| 5,096,562 | A | 3/1992 | Boozenny et al. |
| 5,169,509 | A | 12/1992 | Latz et al. |
| 5,171,411 | A | 12/1992 | Hillendahl et al. |
| 5,200,049 | A | 4/1993 | Stevenson et al. |
| 5,445,721 | A | 8/1995 | Bower |
| 2003/0136672 | A1 | 7/2003 | Barrett |
| 2003/0173217 | A1 | 9/2003 | Crowley |
| 2004/0140208 | A1 | 7/2004 | German et al. |

FOREIGN PATENT DOCUMENTS

EP    1 355 343 A2    10/2003

*Primary Examiner*—Rodney G McDonald
*Assistant Examiner*—Michael Band
(74) *Attorney, Agent, or Firm*—Foley & Lardner LLP

(57) ABSTRACT

An end-block for electrically energising a rotatable tubular target in a vacuum coating installation is disclosed. The end-block has a rotary electrical contact that reduces the joule heating effects when operating in alternating current mode. When compared to known end-blocks, this is achieved by increasing the number of contact areas between a contacting ring and a series of circumferentially mounted contacting shoes. Also the contact shoes are being pressed radially outwardly by means of resilient elements against the contacting ring.

12 Claims, 2 Drawing Sheets

END-BLOCK FOR A ROTATABLE TARGET SPUTTERING APPARATUS

FIELD OF THE INVENTION

The invention relates to the technical field of sputtering apparatus with a rotating tubular sputtering target that are commonly used now for the deposition of thin films. More specifically the invention relates to the end-blocks that amongst others transfer electrical power to the rotating sputtering target.

BACKGROUND OF THE INVENTION

Large area, vacuum deposition equipment using tubular rotating targets has become the predominant method to deposit thin films on large area substrates such as e.g. window glass. In these installations, material is sputtered away from the rotating target by means of a plasma. The throughput through these huge installations determines their economic profitability. This throughput is—next to other factors such as uptime—determined by the physical deposition speed of material on the substrate. On its turn, this deposition speed depends on a number of factors such as the material that is to be deposited, the line speed, but above all it depends on the electrical voltage and current that is supplied to the target. Indeed, the positive ions of the plasma are accelerated towards the target by a high voltage where they eject material when impinging on the surface of the target. Because this voltage determines the energy by which these ions impinge on the target and the current supplied to the target is proportional to the number of ions impinging, the power supplied (i.e. the product of current and voltage) to the target will greatly influence the deposition rate. Hence, the higher the electric power, the faster the target material is eroded and deposited on the substrate.

While in the first rotating target installations (see U.S. Pat. No. 4,356,073) the electric supply to the target was a direct current, it became soon apparent that this DC supply had some serious drawbacks when depositing materials in a reactive atmosphere: dielectric reaction products tended to cover—to 'poison'—the target and the positively biased vacuum installation walls—acting as an anode—and impede further sputtering. Due to the dielectric formed on the target, 'arcing' became a major problem. 'Arcing' is the occurrence of sparks at the target surface between the negatively biased uncoated region and the—due to the impact of positive ions—positively charged poisoned area. It was soon discovered that the use of an alternating current supply between two separate targets could alleviate this 'poisoning' problem and associated arcing problem (see U.S. Pat. No. 5,169,509) while maintaining a stable plasma as the walls of the vacuum enclosure were no longer electrically active.

While AC sputtering allowed for a further increase in power supplied to the target, it also led to new problems. The typical frequencies that are used are between 10 and 100 kHz at a current drawn of 300 A. Regime voltage is typically 300 to 500 V. At these frequencies, most of the current flows through the outer regions of a current conductor, a phenomenon that is well known as the skin effect. The current density drops by a factor 1/e ('e' being the natural logarithm base number) within a thickness 'δ' (in m) that is given by:

$$\delta = (\pi \nu \mu \sigma)^{-1/2}$$

wherein:

ν is the frequency of the current (in Hz),

μ is the magnetic permeability (in H/m),

σ is the conductivity of the material (in S/m)

For copper this leads already to a skin depth of ab. 670 μm at 10 kHz leading to very high local current densities and joule heating of the outer surface of conductors when used in a sputtering apparatus of the kind envisaged.

Mainly the rotatable electrical contact between current supply and target turns out to be a critical spot. Outside this region, the use of multifilament current leads can greatly overcome the problem. While many rotary electrical connections are known in the art, for examples in electrical motors and generators, the requirements that are asked from a rotary electrical connection for an end-block are quite different. As already mentioned, the currents and voltages used are relatively large given also the fact that a typical end-block is contained in only 20 cm×15 cm×15 cm. Also the frequency is large compared to the known rotary connections. On the other hand the number of revolutions at which the rotary connection must work is rather moderate: at the most 100 rotations per minute. Hitherto a couple of solutions have been suggested in order to overcome this joule heating and to counter its effects in rotatable sputtering target end-blocks.

US 2003/0136672 A1 describes the use of four semi-cylindrical stationary contact brushes that are forcedly enclosing the shaft that is rotating with the target. Current travels through a path from the brush block through the shaft to the target tube. Water flows through the shaft thus limiting the temperature rise due resistive heating by the current.

US 2003/0173217 A1 describes the use of the coolant conduit itself as a conducting member disposed within the rotary cathode device. Stationary brushes, immersed in the coolant, connected to this conducting member spread the current over the whole rotary cathode. As the coolant flows through the conducting member, the effects of the resistive heating are countered.

Although the above prior-art may alleviate the consequences of the joule heating, they do not reduce the root cause of the problem, namely the restriction of the current carrying area due to the skin effect.

SUMMARY OF THE INVENTION

It is therefore an object of the current invention to raise the throughput of large area coating installations by enabling higher power levels to be supplied to the targets. Another object of the present invention targets the reduction of the joule heating of the rotatable electrical contact inside the end-block. An advantage of the present invention is that it reduces the root cause of the joule heating—namely the magnitude of the skin effect—rather than countering the symptoms—i.e. the increased temperature—by having an improved cooling as in the prior art solutions. A further object of the invention is to provide an end-block with a rotatable electrical contact that is less prone to wear, more specifically groove formation.

According a first aspect of the invention an end-block for energising a rotatable target is provided. End-blocks are known in the art. They serve to rotatably hold the target tube, to make it turn and to electrically feed the target tube whilst feeding and evacuating a cooling liquid to it. Over and above the end-block must maintain vacuum integrity as the plasma processes normally take place at low pressures. Two target support configurations are currently in use: one where both ends of the tube are held by an end-block such as e.g. disclosed in U.S. Pat. No. 5,096,562 and one system wherein the target tube is held at one end only such as e.g. disclosed in U.S. Pat. No. 5,200,049. In the latter case a single end-block provides all the necessary functionalities (support, rotation, electricity, vacuum integrity and coolant). In the former case, different functionalities can be allocated to different end-blocks: e.g. the first end-block provides coolant and electrically energises the target, while the second drives the target rotation. The invention concerns the end-block that provides for the rotatable electrical connection between the power source and the rotatable target in either of the two target support configurations.

Such an end-block with a rotatable connection comprises a socket and a spindle coaxially mounted inside the socket. The spindle and socket can rotate relative to one another by means of ball bearings or sliding bearings or any other means known in the art. The socket comprises at least one electrical contact ring that connects to a first electrical end. Such a contact ring is made of an electrically conductive material that is sufficiently resistant to slide wear. The materials used most to this end are copper or brass or bronze.

The inventive end-block (independent claim 1) is characterised by the features that the spindle comprises a series of electrically conducting shoes i.e. the shoes move with the spindle that is situated inside the socket. Such shoes are also called brushes. In order to balance the mechanical forces on the spindle, the shoes must be mounted evenly distributed on the circumference of the spindle. So at least two of these shoes must be present to equalise the radial forces on the spindle. The shoes are in electrical and mechanical sliding contact with the inner surface of the socket ring or rings. In order to ensure this contact at all times, each and every one of these shoes is pressed individually by a resilient element in the radially outward direction i.e. against the inner surface of the ring or rings. All the shoes are electrically connected to a second electrical end namely the spindle.

Although two shoes suffice to make the invention work, it is more preferable to use an integer number of shoes from 4 to 16 to ensure a connection with low electrical noise (dependent claim 2). With a lower number of shoes, the noise will not average out very well. With 17 or more shoes the reduction in noise is insignificant.

Between the shoes, there is a gap sufficiently wide that the shoes can move independently from one another. The gaps are such that they allow the ring to cool down after passage of the shoe. It is preferred that less than 70% of the circumference of the inner ring or rings of the socket is covered by the shoes. More specifically it is meant that the sum of the arc lengths spanned by the shoes is less than 0.70 times the circumference of the inner ring or rings of the socket. It is even more preferred that the shoes cover less than 50% of the circumference of the spindle. The contact between the shoes and the ring or rings must occur in a substantially dry environment (i.e. not in a liquid) in order to allow the formation of a conducting patina on the ring or rings.

Although the shoes are preferably mounted in one plane perpendicular to the axis of the spindle, other configurations wherein say the even numbered shoes are situated in a first plane, and the odd numbered shoes are situated in a second plane where the first plane is slightly axially offset from the second plane are equally well possible if space within the end-block allows for this configuration.

The number of rings making up the first electrical contact is subject of the dependent claim 3. As the skin effect localises the AC current to the outer regions of the conductor, having a stack of several rings parallel to one another leads to more current carrying surface with the shoes. The rings in the stack have to be separated from one another. Any dielectric material that can withstand a sufficiently high temperature is suitable for this. An example are polyimides, or polytetrafluoroethylene (PTFE) or polyphenol polymeric materials that are easily available in sheet form. The stack must be held together by means of gluing or bolting, or by means of clamping.

Each one of the shoes must contact at least one of the rings in order for the shoe to add to the overall current carrying capacity. Depending on the exact positioning of the shoes on the spindle—when part of the shoes are axially offset from the remaining part for example—some shoes may not come into contact with some rings. This can be advantageous to reduce the thermal loading of the ring and the shoe. On the other hand the number of contact areas should be as large as possible in order to limit the skin effect, the largest number of contact points obviously being reached when each one of the shoes meets every single ring.

All of the rings are connected in parallel to the electrical end. By preference this is done by one electrical lead per ring. The lead is by preference made of multifilament wire and the leads are isolated from one another.

In order to ensure the continuous electrical contact between the ring or rings and the sliding shoes, the shoes are pressed against the rings by means of resilient elements (dependent claim 4). Preferably the shoes are mounted such that they abut at a position when the radius formed by the outer surface of the shoes is somewhat larger than the ring's inner surface radius, to ease the mounting of the spindle. One resilient element per shoe is in principle enough to press the shoes against the rings, but for a good contact it is more preferred if two, three or even four spring elements are present acting independently from one another. The contact pressure exerted by the shoes on the rings is important because a too low pressure will lead to excessive electrical erosion while a too high pressure will lead to high mechanical wear of both ring and shoe. The resilient elements can act as current leads towards the spindle. Or the current is led through separate multifilament conductors that on the one end connect to the shoe and on the other hand connect to the second electrical end. In the latter case it is preferred that two or three or four or even more such connections are made, again to alleviate the skin effect.

The type of resilient elements to be used is the subject of dependent claims 5 and 6. As resilient elements metallic springs can be used in one of their many known forms such helically coiled wire springs, or blade springs to name just a few. Also elastomeric springs are not excluded although they must be able to withstand high temperatures. Therefore high performance polymers have to be used. One such a polymer is Hypalon® (chlorosulfonated polyethylene) made by DuPont-Dow Elastomers.

At least one of the shoe footprints—i.e. the shape by which the shoes contact the socket—has a trapezoidal form (dependent claim 7). Such a form is beneficial in order to plough away possible wear particles or dust emanating from the shoes. The occurrence of such wear particles is inherent to a sliding electrical contact. By having at least one of the shoes with such a footprint, this debris is moved to the outer sides of the contacting track.

By milling a hollow at the side of the contact ring, wear particles can be accumulated in this hollow without it interfering with the other parts of the end-block (dependent claim 8). This prevents the formation of grooves that tend to occur in prior-art rotary electrical contacts in end-blocks.

The material, out of which the contacting shoes are shaped, contains a mixture of graphite supplemented with a metal. As a metal copper and silver are used the most. The amount of metal content is used to tune the conductivity of the material. The lower the conductivity the deeper the current will penetrate into the conductor i.e. the larger the skin depth for a given frequency. On the other hand the overall resistance of the conductor will increase and so will the joule heating. So the optimal choice of conductivity is a matter of experimentation. To lower the friction other ingredients are added such as molybdenumdisulfide ($MoS_2$).

Up to now the socket and spindle have been considered to be relatively moveable to one another. As the end-block is fixed relative to the sputtering chamber two possibilities arise:
- either the socket is connected to the end-block and thus acts as the stator of the electrical rotatable contact. The spindle is then electrically connected to the rotatable target (dependent claim 10) and acts as a rotor,
- or the spindle is connected to the end-block and the target is then electrically connected to the socket (dependent claim 11). The socket then becomes the rotor, while the spindle is the stator.

In both cases it remains valid that the connecting shoes are pressed in the outwardly radial direction.

According a second aspect of the invention, a sputtering apparatus is provided (claim 12). The sputtering apparatus is characterised by the fact that it comprises the inventive end-block with a rotatable electrical contact as described here above and claimed in any one of the claims 1 to 11.

BRIEF DESCRIPTION OF THE DRAWINGS

The invention will now be described into more detail with reference to the accompanying drawings wherein.

DESCRIPTION OF THE PREFERRED EMBODIMENTS OF THE INVENTION

Figure 1:
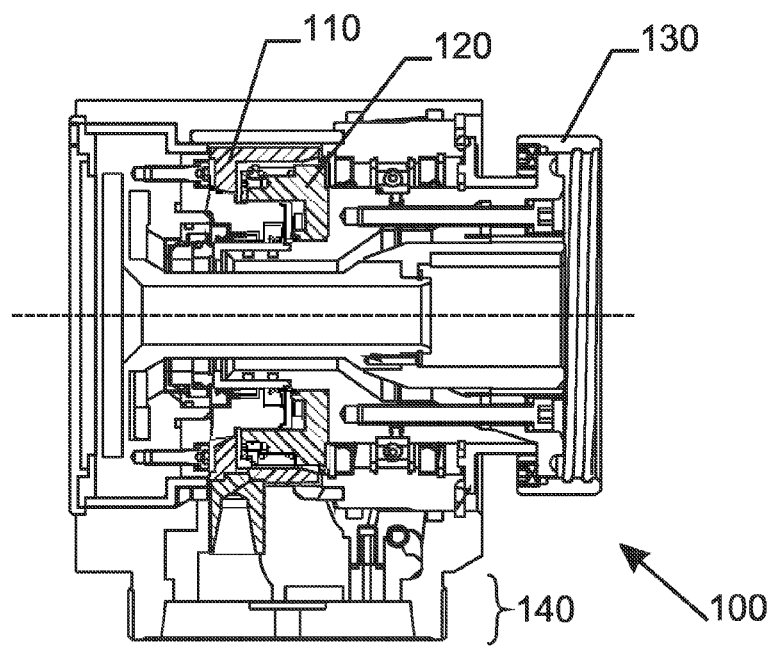
FIG. 1: shows a cross section of an end-block with an indication of the rotary electrical contact.

The invention concerns an end-block of which FIG. 1 shows an actual cross section 100. This particular end-block combines the functionalities of rotatably carrying one end of the tube, feeding and collecting coolant—usually water—to and from the target and transferring electrical current to the target. As the invention primarily concerns the latter functionality, the implementation of the other functionalities will not be discussed in detail since they are not crucial to understand the gist of the invention. The target (not shown) is inserted into and held by the clamping ring 130. The end-block 100 is held by a quick release coupling (not shown) that engages the holding section 140 to the sputtering apparatus (not shown). The socket 110 receives the spindle 120, the latter being rotatable with respect to the former.

Figure 2:
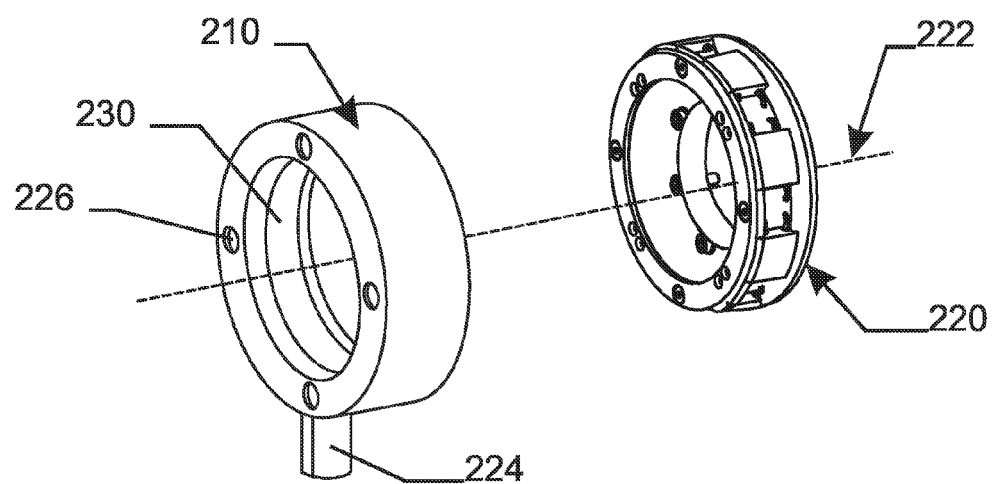
FIG. 2: shows the major parts of the electrical rotary electrical contact with the spindle and the receiving socket.

FIG. 2 shows an isometric view in which the cylindrical socket 210 and the spindle 220 are shown separated from one another. Both parts share the same rotation axis 222. A single contact ring 230 is situated inside the socket 210. The whole socket 210 is electrically connected to a female electrical connector 224. Holes such as 226 to fix the socket to the rest of the end-block by means of screws are foreseen.

Figure 3:
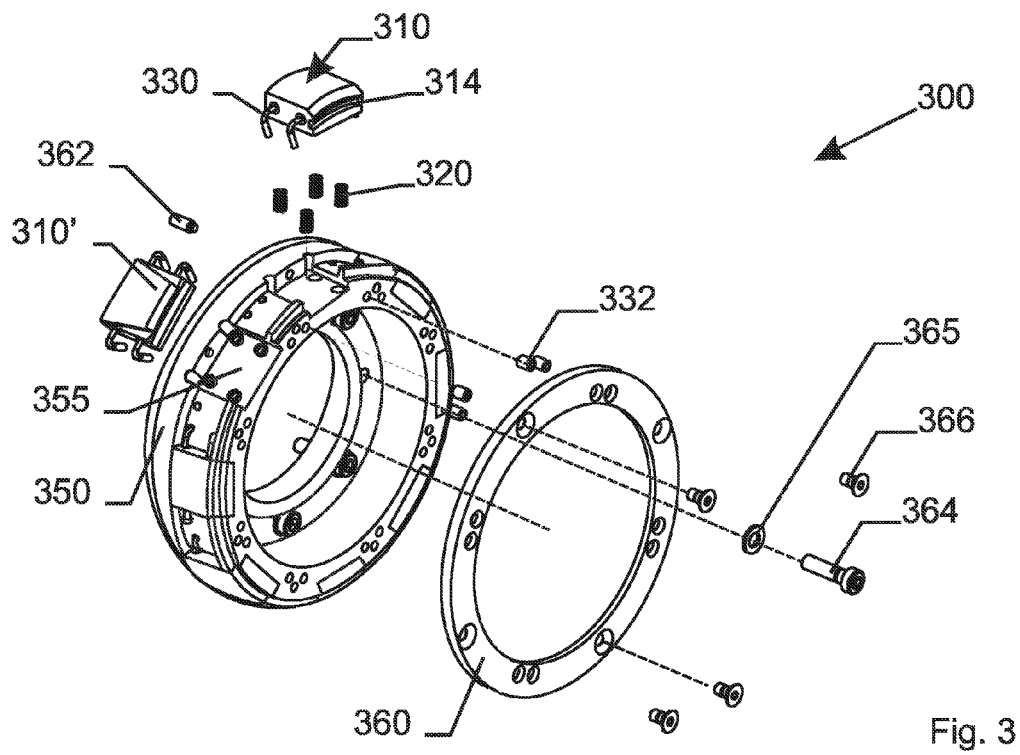
FIG. 3: shows an isometric exploded view of the rotary electrical contact.

The structural features of the spindle are most clearly depicted in the exploded view of FIG. 3. The spindle 300 is composed of a holder ring 350 in which cavities such as 355 have been machined out. Each of these cavities—eight in total—holds an electrically conducting shoe such as 310, 310'. Each of these shoes 310, 310' is pushed outwardly by a series of four helical metal springs of which one is marked with 320. In the assembled spindle 300 the shoes are held in place by a rim 314 that extends out of the shoeprint of the shoe in the direction tangential to the spindle. At the opposite side of the shoe the same rim is present (not shown). During mounting, the shoes are held in place by the retainer pins such as 362 and the clamping ring 360. The rims 314 of the shoe 310,310' abut against the retainer pins 326 and clamping ring 360 when released after depressing. The clamping ring 360 is held on the holder ring 350 by means of a series of socket flat head screws like 366. The electrical contact between the shoes 310, 310' and the holding ring 350 is ensured by means of four bunches of multifilament wire such as 330 per shoe. The bunches are held in intimate contact with the holding ring by means of the screws 332 that are sunk under the clamping ring 360. Socket screws 364 with washers 365 tightly fasten the spindle 300 to further parts (not shown) that electrically connect to the target.

Note that the shoe 310' has a trapezoidal footprint compared to the regular shoe 310. In this way wear particles are efficiently kept from the sliding electrical contact area. The shoe diametrically opposite to the shoe 310' also has such a shape (not visible on the figure).

Figure 4:
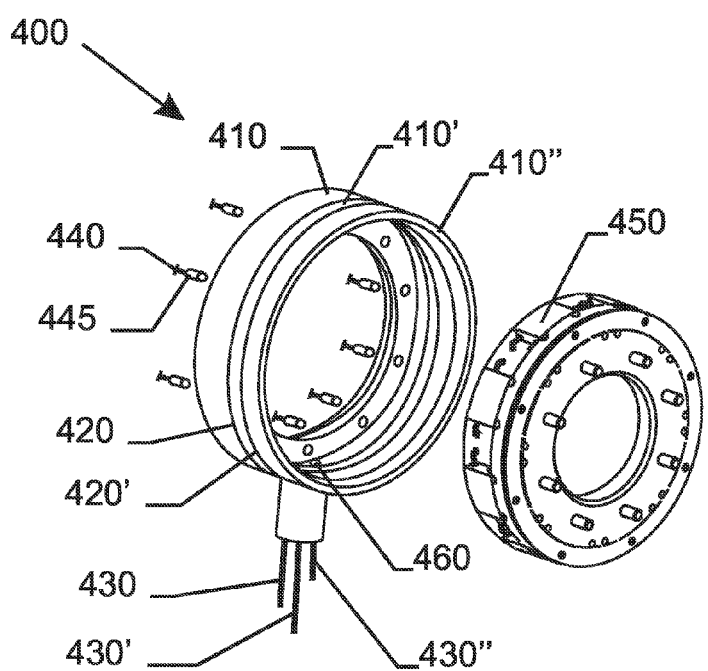
FIG. 4: shows a socket with multiple contacting rings stacked together.

Finally FIG. 4 shows a cylindrical socket comprising three contacting rings 410, 410' and 410" each one of the contacting rings making contact with each one of the conducting shoes such as 450. The contacting rings 410, 410' and 410" are isolated from one another with isolation rings 420 and 420' made of a thin PTFE sheet. Each one of the contacting rings 410, 410' and 410" has an individual lead 430, 430' and 430" towards the current source (not shown). The three contacting rings are glued to one another and in addition are fastened to one another by means of a series of socket flat head screws like 440 that thread into the last contact ring 410" and are isolated from the first two contacting rings 410 and 410' by means of isolation bushings (again made of PTFE) like 445. A hollow 460 is made in the ring 410 in order to collect wear particles that are swept to the side by the shoes with the trapezoidal footprint. In this embodiment the number of contact areas is increased from 8 to 3×8, which is beneficial to reduce the skin effect.

The person skilled in the art will readily understand that various modifications in form and detail may be made to the above embodiments without going beyond the scope of the invention as defined in the claims.

The invention claimed is:

1. An end-block for energising a rotatable sputtering target, comprising a cylindrical socket and a spindle coaxially mounted inside said socket, said socket and spindle being relatively rotatable to one another, said socket comprising at least one electrical contact ring for forming an electrical end, wherein said spindle comprises at least two electrically conducting shoes, said shoes for providing an electrically sliding contact with the inner surface of said ring, each of said shoes being pressed radially and outwardly against said inner surface by means of at least one resilient element, said shoes being electrically connected in parallel to said spindle.

2. The end-block according to claim 1, wherein the number of electrically conducting shoes is any one number from four to sixteen.

3. The end-block according to claim 1,
wherein said socket comprises at least two of said electrical contact rings, said rings being mounted coaxially to one another and electrically insulated from one another, each one of said shoes making electrical contact with the inner surface of at least one of said rings, all of said electrical contact rings being connected in parallel to said electrical end.

4. The end-block according to claim 1,
wherein each of said shoes is pressed against each of said rings by a number of resilient elements, said number being one of one or two or three or four.

5. The end-block according to claim 4, wherein said resilient elements are metallic springs.

6. The end-block according to claim 4, wherein said resilient elements are elastomer springs.

7. The end-block according to claim 1, wherein at least one of said electrically conducting shoes has a trapezoidal footprint contacting the inner surface of said at least one ring.

8. The end-block according to claim 1,
wherein said socket has a hollow in said at least one ring for collecting wear particles from said shoes.

9. The end-block according to claim 1,
wherein said shoes are made from material comprising silver or copper or graphite or molybdenum disulfide.

10. The end-block according to claim 1, wherein said socket is mounted immovable to said end-block.

11. The end-block according to claim 1,
wherein said spindle is mounted immovable to said end-block.

12. A sputtering apparatus comprising an end-block according to claim 1.

* * * * *